United States Patent
Chang et al.

(10) Patent No.: US 7,541,290 B2
(45) Date of Patent: Jun. 2, 2009

(54) METHODS OF FORMING MASK PATTERNS ON SEMICONDUCTOR WAFERS THAT COMPENSATE FOR NONUNIFORM CENTER-TO-EDGE ETCH RATES DURING PHOTOLITHOGRAPHIC PROCESSING

(75) Inventors: Chong Kwang Chang, Kangwon (KR); Wan Jae Park, Kyunggi (KR); Len Yuan Tsou, New York City, NY (US); Haoren Zhuang, Hopewell Junction, NY (US); Matthias Lipinsky, Poughkeepsie, NY (US); Shailendra Mishra, Singapore (SG)

(73) Assignees: Samsung Electronics Co., Ltd. (KR); International Business Machines Corporation, Armonk, NY (US); Infineon Technologies AG (DE); Chartered Semiconductor Manufacturing, Ltd., Singapore (SG)

( * ) Notice: Subject to any disclaimer, the term of this patent is extended or adjusted under 35 U.S.C. 154(b) by 258 days.

(21) Appl. No.: 11/683,648

(22) Filed: Mar. 8, 2007

(65) Prior Publication Data

US 2008/0220609 A1    Sep. 11, 2008

(51) Int. Cl.
    *H01L 21/302* (2006.01)
(52) U.S. Cl. .............. 438/715; 438/700; 438/717; 438/723
(58) Field of Classification Search ......... 438/700, 438/702, 706, 714, 715, 717, 723, 724
    See application file for complete search history.

(56) References Cited

U.S. PATENT DOCUMENTS

| | | | |
|---|---|---|---|
| 5,856,240 A * | 1/1999 | Sinha et al. .......... 438/758 |
| 6,458,688 B1 | 10/2002 | Wenski et al. | |
| 6,537,677 B1 * | 3/2003 | Mercaldi et al. ........... 428/469 |
| 6,663,708 B1 * | 12/2003 | Morita et al. ........... 117/3 |
| 6,846,618 B2 | 1/2005 | Hsu et al. | |
| 6,847,014 B1 * | 1/2005 | Benjamin et al. ........ 219/444.1 |
| 6,940,150 B2 | 9/2005 | Watanabe | |
| 2002/0102860 A1 * | 8/2002 | Mercaldi et al. ........... 438/758 |
| 2002/0197749 A1 | 12/2002 | Knight et al. | |
| 2006/0284261 A1 * | 12/2006 | Sriram ............. 257/369 |
| 2007/0042603 A1 * | 2/2007 | Kropewnicki et al. ....... 438/689 |

FOREIGN PATENT DOCUMENTS

| | | |
|---|---|---|
| JP | 10-150019 | 6/1998 |
| JP | 2002-367899 | 12/2002 |
| JP | 2003-017559 | 1/2003 |
| JP | 2003-297725 | 10/2003 |
| JP | 2004-119497 | 4/2004 |
| KR | 10-0252210 B1 | 1/2000 |
| KR | 1020010003781 A | 1/2001 |
| KR | 1020010095798 A | 11/2001 |
| KR | 1020030003649 A | 1/2003 |
| KR | 1020040076138 A | 8/2004 |
| KR | 1020050096391 A | 10/2005 |

* cited by examiner

*Primary Examiner*—Kin-Chan Chen
(74) *Attorney, Agent, or Firm*—Myers Bigel Sibley & Sajovec

(57) ABSTRACT

Methods of forming integrated circuit devices include steps to selectively widen portions of a mask pattern extending adjacent an outer edge of a semiconductor wafer. These steps to selectively widen portions of the mask pattern are performed so that more uniform center-to-edge critical dimensions (CD) can be achieved when the mask pattern is used to support photolithographically patterning of underlying layers (e.g., insulating layers, antireflective coatings, etc.).

8 Claims, 4 Drawing Sheets

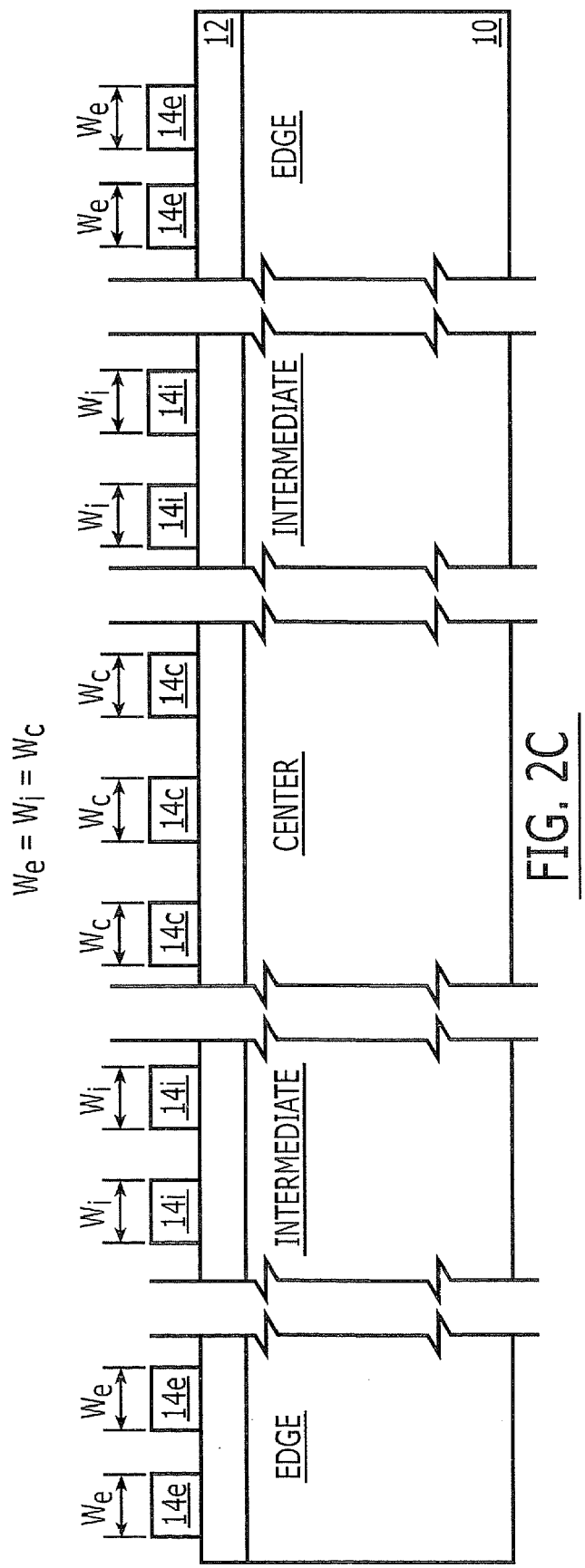

METHODS OF FORMING MASK PATTERNS ON SEMICONDUCTOR WAFERS THAT COMPENSATE FOR NONUNIFORM CENTER-TO-EDGE ETCH RATES DURING PHOTOLITHOGRAPHIC PROCESSING

FIELD OF THE INVENTION

The present invention relates to integrated circuit fabrication methods and, more particularly, to methods of fabricating mask patterns on semiconductor wafers.

BACKGROUND OF THE INVENTION

Processes for fabricating integrated circuit devices typically include the formation of a relatively large array of integrated circuits that are replicated at side-by-side locations on an integrated circuit wafer. These fabricating processes also typically include the formation of multiple levels of electrically insulating layers that extend across the entire surface of a wafer and are selectively and individually patterned using conventional photolithography techniques. During photolithography, an organic material layer, such as a photo-resist (PR) mask layer, may be deposited on an electrically insulating layer and then patterned to define a mask. This mask may contain a pattern that is replicated for each of the integrated circuits to be formed adjacent an interior of the semiconductor wafer and adjacent an edge (i.e., periphery) of the semiconductor wafer. Unfortunately, the steps to pattern the mask layer into a mask may result in mask patterns having non-uniform lateral dimensions that vary according to location on the semiconductor wafer. For example, it is not uncommon for a mask pattern that defines a critical dimension (CD) of a structure within in an integrated circuit extending adjacent the edge of the semiconductor wafer to be narrower than the corresponding mask pattern extending adjacent an interior of the semiconductor wafer (i.e., near the center of the wafer). This nonuniformity in the mask pattern dimensions, which frequently results from the non-uniform etching characteristics associated with wafer-scale etching processes, can lead to complications in wafer level processing and result in poor device yield and reliability.

SUMMARY OF THE INVENTION

Methods of forming integrated circuit devices according to embodiments of the present invention include steps to selectively widen portions of a mask pattern extending adjacent an outer edge of a semiconductor wafer. These steps to selectively widen portions of the mask pattern are performed so that more uniform center-to-edge critical dimensions (CD) can be achieved when the mask pattern is used to support photolithographic patterning of underlying layers (e.g., insulating layers, antireflective coatings, etc.).

These methods include forming a first electrically insulating layer on a semiconductor wafer and then forming a mask pattern on the first electrically insulating layer. First portions of the mask pattern, which extend adjacent a periphery of the semiconductor wafer, are selectively widened relative to corresponding second portions of the mask pattern extending adjacent an interior of the semiconductor wafer. This selective widening step is achieved by depositing a second electrically insulating layer having temperature-dependent deposition rate characteristics on the mask pattern. These temperature-dependent characteristics result in a second electrically insulating layer that is thicker on the peripheral portions of the semiconductor wafer and thinner on the interior portions of the semiconductor wafer. This fast (near edge) versus slow (near center) difference in the deposition rate characteristics of the second electrically insulating layer compensates for the narrower portions of the mask pattern extending adjacent the periphery of the semiconductor wafer.

In some of these embodiments, the second electrically insulating layer may be an organic polymer layer, including an organic polymer layer containing carbon and fluorine, such as $C_xF_y$ or $C_xH_yF_z$. Moreover, the step of depositing the second electrically insulating layer is performed while simultaneously controlling a temperature of the semiconductor wafer to have a nonuniform center-to-edge temperature profile. This nonuniform temperature profile may be achieved by establishing a corresponding nonuniform temperature profile in an underlying wafer support structure (e.g., wafer stage) within a processing chamber. A photolithographically defined etching step is then performed to pattern the electrically insulating layer. This selective etching step is performed using the mask pattern with the selectively widened portions as an etching mask.

BRIEF DESCRIPTION OF THE DRAWINGS

FIGS. 2A-2C are cross-sectional illustrations of intermediate structures that illustrate methods of forming integrated circuit devices according to embodiments of the present invention.

DETAILED DESCRIPTION OF PREFERRED EMBODIMENTS

Figure 1:
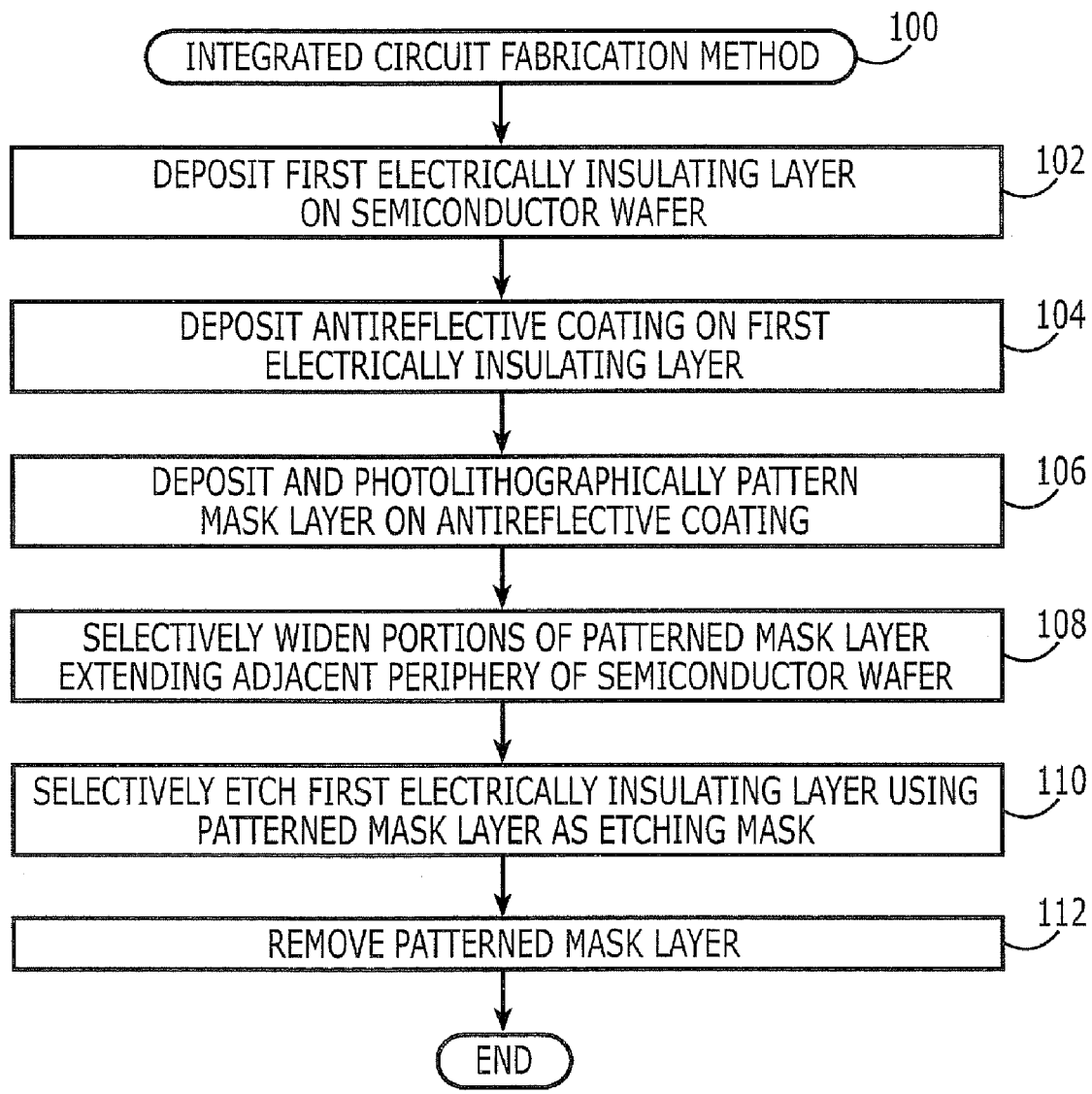
FIG. 1 is a flow diagram of steps that illustrates methods of forming integrated circuit devices according to embodiments of the present invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout.

Referring now to the flow diagram of FIG. 1, methods 100 of forming integrated circuit devices include forming a first electrically insulating layer on a primary surface of semiconductor wafer, Block 102. This first electrically insulating layer may be formed relatively close to the primary surface, or may be an inter-layer dielectric layer that is separated from the primary surface by one or more underlying layers and integrated circuit structures. This first electrically insulating layer may be formed of a material such as silicon oxide or silicon nitride, for example, however, other electrically insulating and dielectric materials may also be used. As illustrated by Blocks 104-106, an antireflective coating (ARC) layer (optional) is deposited on the first electrically insulating layer and then a mask layer is deposited on the coating. This mask layer is then photolithographically patterned to define a mask that extends across the semiconductor wafer.

Portions of mask that extend adjacent a periphery of the semiconductor wafer are then selectively widened to compensate for a relative narrowing of these portions during the step of patterning the mask layer, Block 108. This step of selectively widening portions of the mask pattern is achieved by depositing a second electrically insulating layer having temperature-dependent deposition rate characteristics, on the mask pattern. These temperature-dependent characteristics result in a second electrically insulating layer that is thicker on the peripheral portions of the semiconductor wafer and thinner on the interior portions of the semiconductor wafer. This fast (near edge) versus slow (near center) difference in the deposition rate characteristics of the second electrically insulating layer compensates for the narrower portions of the mask extending adjacent the periphery of the semiconductor wafer. The second electrically insulating layer may be an organic polymer layer, including an organic polymer layer containing carbon and fluorine, such as $C_xF_y$ or $C_xH_yF_z$.

The step of depositing the second electrically insulating layer is performed while simultaneously controlling a temperature of the semiconductor wafer to have a nonuniform center-to-edge temperature profile. In particular, a chuck (e.g., wafer stage), which supports the semiconductor wafer in a processing chamber, may be configured to provide a high-to-low temperature profile across the wafer, with the center of the wafer being held at a higher temperature relative to an edge of the wafer. Referring now to Block 110, the first electrically insulating layer is then selectively etched, using the patterned mask layer (with selectively widened portions) as an etching mask. The patterned mask layer is then removed to complete the photolithography process, Block 112.

Figure 2A:
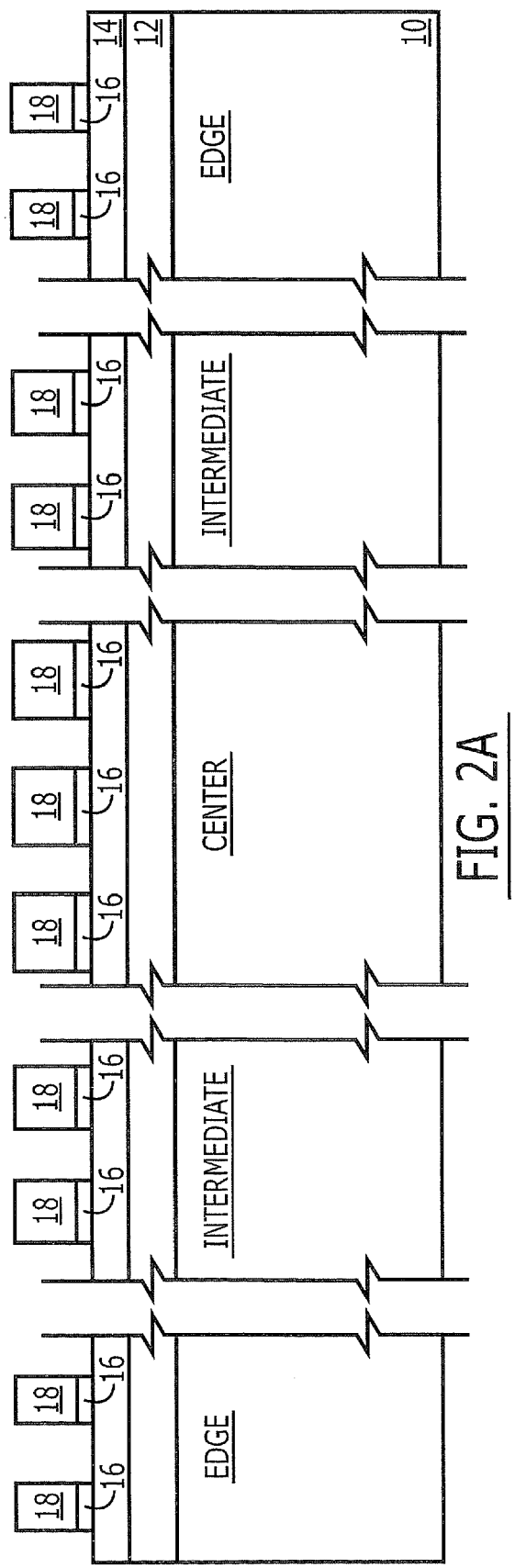

The steps described above with respect to FIG. 1 will now be described more fully with reference to FIGS. 2A-2C. As illustrated by FIG. 2A, an electrically insulating layer 12 may be formed on a semiconductor wafer 10. This electrically insulating layer 12 may be a silicon dioxide layer that is conformally deposited across an entire surface of the semiconductor wafer 12, which includes edge, intermediate and center portions having integrated circuit structures (not shown) thereon. The edge portion extends adjacent a periphery of the semiconductor wafer 10 and the center portion extends adjacent an interior portion of the semiconductor wafer 10. The intermediate portion of the semiconductor wafer extends between the interior and edge portions of the semiconductor wafer 10.

Referring still to FIG. 2A, another electrically insulating layer 14 is conformally deposited on the underlying electrically insulating layer 12. This electrically insulating layer 14 may be a silicon nitride layer or other dielectric material layer that can be etched selectively relative to the underlying electrically insulating layer 12. A bottom anti-reflective coating (i.e., BARC) layer (optional) and a layer of photoresist are then formed in sequence on the electrically insulating layer 14. Conventional mask developing and photolithographic patterning techniques may then be performed to generate a mask pattern 18 from the layer of photoresist. During this mask patterning step, the anti-reflective coating may also be selectively etched to define an anti-reflective coating pattern 16. These steps of developing the layer of photoresist may result in the generation of a mask pattern 18 having corresponding shapes with nonuniform lateral dimensions, including nonuniform critical dimensions that are wider adjacent a center of the semiconductor wafer 10 relative to an edge of the semiconductor wafer 10.

Figure 2B:
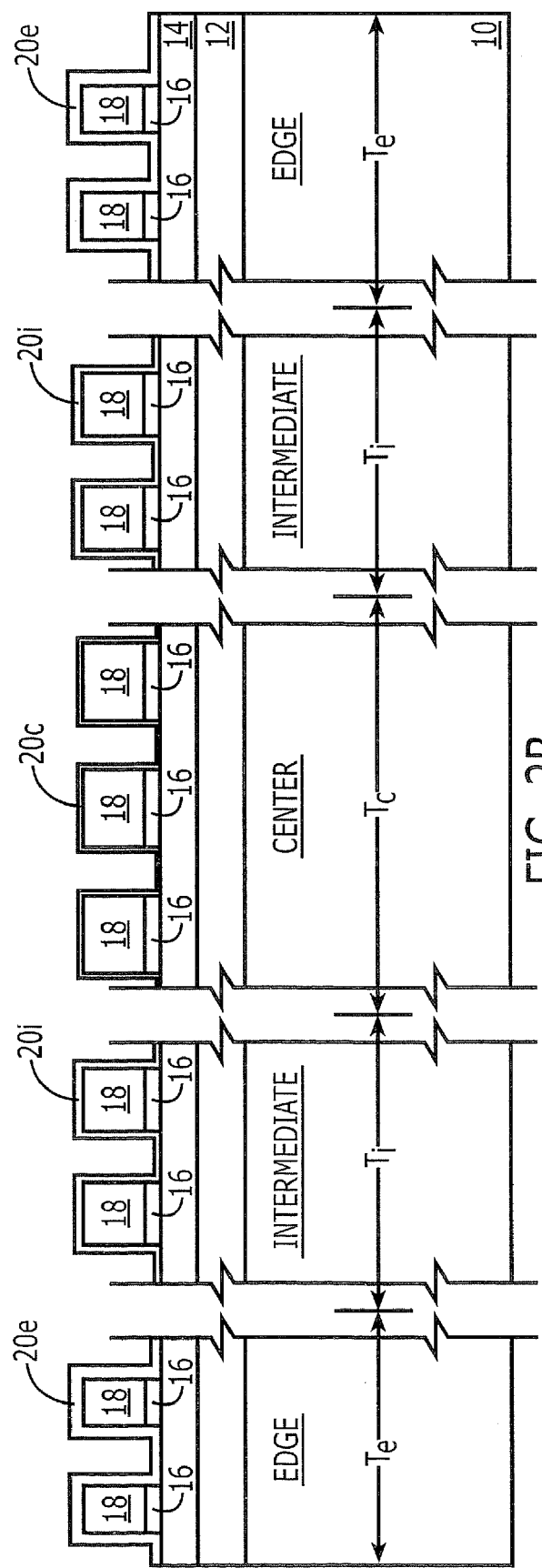

Referring now to FIG. 2B, portions of the mask pattern 18 are then selectively widened by depositing an electrically insulating layer 20 having temperature-dependent deposition rate characteristics, on the mask pattern 18. According to some embodiments of the present invention, this electrically insulating layer 20 may be an organic polymer layer, such as an organic polymer layer including carbon and fluorine (e.g., $C_xF_y$ or $C_xH_yF_z$). During this step of depositing the electrically insulating layer 20, the semiconductor wafer 10 is maintained at a nonuniform temperature, which results in an electrically insulating layer 20 having a nonuniform thickness. In particular, the center of the semiconductor wafer 10 is maintained at a higher temperature (Tc) relative to a temperature (Ti) of an intermediate portion of the semiconductor wafer 10 and a temperature (Te) of an edge portion of the semiconductor wafer 10, where Tc>Ti>Te. These relative temperatures can be adjusted to achieve a nonuniform thickness of the electrically insulating layer 20 that compensates for the nonuniform lateral dimensions in the mask pattern 18 illustrated by FIG. 2A. This nonuniform temperature may be achieved in a deposition processing chamber, by using a wafer support stage (e.g., wafer chuck) that is configured to provide different temperatures across its surface. Based on these different temperatures, the edge, intermediate and center portions of the electrically insulating layer 20 will have different thicknesses, with the edge portion 20e being thicker than the intermediate portion 20i and the intermediate portion 20i being thicker than the center portion 20c.

Referring now to FIG. 2C, a selective etching step is then performed to etch through the electrically insulating layer 14, using the mask pattern 18 and the electrically insulating layer 20 as an etching mask. This etching step results in the generation of a patterned electrically insulating layer having edge regions 14e, intermediate regions 14i and center regions 14c with sufficiently equivalent dimensions (i.e., We≈Wi≈Wc). The mask pattern 18 and the electrically insulating layer 20 is then removed.

Thus, as described above with respect to FIGS. 1 and 2A-2C, methods of forming integrated circuit devices according to embodiments of the invention include forming a first electrically insulating layer on a semiconductor wafer and forming mask pattern on the first electrically insulating layer. First portions of the mask pattern that extend adjacent a periphery of the semiconductor wafer are then selectively widened relative to second portions of the mask pattern that extend adjacent an interior of the semiconductor wafer. This selective widening step is performed by depositing a second electrically insulating layer having temperature-dependent deposition rate characteristics on the mask pattern while simultaneously controlling a temperature of the semiconductor wafer to having a nonuniform center-to-edge temperature profile. The electrically insulating layer is then selectively etched using the mask pattern with the selectively widened portions as an etching mask.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming an integrated circuit device, comprising the steps of:

forming a first electrically insulating layer on a semiconductor wafer;

forming mask pattern on the first electrically insulating layer;

selectively widening first portions of the mask pattern extending adjacent a periphery of the semiconductor wafer relative to second portions of the mask pattern extending adjacent an interior of the semiconductor wafer, by depositing a second electrically insulating layer having temperature-dependent deposition rate characteristics on the mask pattern while simultaneously controlling a temperature of the semiconductor wafer to have a nonuniform center-to-edge temperature profile; and selectively etching the electrically insulating layer using the mask pattern with the selectively widened portions as an etching mask.

2. The method of claim 1, wherein the second electrically insulating layer is an organic polymer layer.

3. The method of claim 1, wherein the second electrically insulating layer comprises carbon and fluorine.

4. The method of claim 1, wherein the second electrically insulating layer is a $C_xF_y$ or $C_xH_yF_z$ layer.

5. A method of forming an integrated circuit device, comprising the steps of:

forming mask pattern on a semiconductor wafer; and selectively widening first portions of the mask pattern extending adjacent a periphery of the semiconductor wafer relative to second portions of the mask pattern extending adjacent an interior of the semiconductor wafer, by depositing an electrically insulating layer having temperature-dependent deposition rate characteristics on the mask pattern while simultaneously controlling a temperature of the semiconductor wafer to have a nonuniform center-to-edge temperature profile.

6. The method of claim 5, wherein the electrically insulating layer is an organic polymer layer.

7. The method of claim 5, wherein the electrically insulating layer comprises carbon and fluorine.

8. The method of claim 5, wherein the electrically insulating layer is a $C_xF_y$ or $C_xH_yF_z$ layer.

* * * * *